US005834324A

United States Patent [19]

Nakamoto

[11] Patent Number: 5,834,324

[45] Date of Patent: Nov. 10, 1998

[54] FIELD EMISSION COLD-CATHODE DEVICE AND METHOD OF MANUFACTURING THE SAME

[75] Inventor: Masayuki Nakamoto, Chigasaki, Japan

[73] Assignee: Kabushiki Kaisha Toshiba, Kawasaki, Japan

[21] Appl. No.: 933,058

[22] Filed: Sep. 18, 1997

[30] Foreign Application Priority Data

Sep. 18, 1996 [JP] Japan .................................... 8-246721

[51] Int. Cl.$^{6}$ ...................................................... H01L 21/00

[52] U.S. Cl. .................................. 438/20; 257/10; 445/50

[58] Field of Search ................................ 438/20; 257/10; 445/50

[56] References Cited

U.S. PATENT DOCUMENTS 4,307,507 12/1981 Gray et al. ................................ 29/580

5,580,827 12/1996 Akamine ................................. 437/225

OTHER PUBLICATIONS

C.A. Spindt, et al., "Physical Properties of Thin–film Field Emission Cathodes with Molybdenumn Cones", Journal of Applied Physics, vol. 47, No. 12, Dec. 1976, pp. 5248–5263.

H.F. Gray, et al., "A vacuum Field Effect Transistor Using Silicon Field Emitter Arrays", IEDM Tech, Dig. 1986, pp. 776–779.

*Primary Examiner*—Jey Tsai

*Assistant Examiner*—David A. Zarneke

*Attorney, Agent, or Firm*—Oblon, Spivak, McClelland, Maier & Neustadt, P.C.

[57] ABSTRACT

A field emission cold-cathode device has a supporting substrate, and an emitter for emitting electrons disposed on the supporting substrate. The supporting substrate is essentially formed of a transparent synthetic resin. The emitter is formed by molding a portion of a conductive material layer such as Au which has been disposed on the supporting substrate into a conical shape. The conductive material layer functions also as a cathode wiring. An engaging concave portion is formed on a surface of the emitter to be bonded with the supporting substrate. In conformity with this engaging concave portion, a convex portion is integrally formed on the supporting substrate so as to be hermetically fitted in the engaging concave portion.

31 Claims, 7 Drawing Sheets

FIELD EMISSION COLD-CATHODE DEVICE AND METHOD OF MANUFACTURING THE SAME

BACKGROUND OF THE INVENTION

This invention relates to a field emission cold-cathode device to be employed for a vacuum micro-device, etc. and also to a method of manufacturing the cold-cathode device.

Recently, the development of field emission cold-cathode device through a utilization of semiconductor processing techniques has been intensively studied. Typical example of which is the one proposed by C.A. Spindt et al., (Journal of Applied Physics, Vol. 47, 5248 (1976)). This field emission cold-cathode device can be manufactured by the steps of forming an $SiO_2$ layer and a gate electrode layer on an Si monocrystal-line substrate, forming a hole having a diameter of about 1.5 $\mu$m, and forming, by means of vapor deposition, a conical emitter in the hole for actuating a field emission. This manufacturing method will be explained more in detail by referring to FIGS. 7A to 7C.

First of all, an $SiO_2$ layer is formed as an insulating layer on an Si monocrystalline substrate 101. Then, a Mo layer 103 to be formed into a gate electrode layer and an Al layer 104 to be used as a sacrifice layer are formed on the $SiO_2$ layer by means of sputtering method for instance. Thereafter, an etching is performed to form a hole 105 having a diameter of about 1.5 $\mu$m and passing through the layers 102, 103 and 104 (FIG. 7A).

Then, an emitter 107 which is conical in shape for actuating a field emission is formed in the hole 105 by means of vapor deposition (FIG. 7B). The formation of this emitter 107 is performed by vacuum-depositing a material for the emitter such as Mo from the direction perpendicular to the substrate 101 while rotating the substrate 101. On this occasion, the opening size of pin-hole which corresponds to the opening size of the hole 105 is gradually decreased as the deposition of Mo layer 106 on the Al layer 104 increases, and ultimately becomes zero. Accordingly, the diameter of top surface of the emitter 107 being deposited in the hole 105 through this pin-hole becomes increasingly small in proportion to a decrease in size of the pin-hole, thus forming an emitter of conical shape. The superfluous portion of the Mo layer 106 deposited on the Al layer 104 is subsequently removed (FIG. 7C).

However, the aforementioned method as well as the field emission cold-cathode device obtained by the aforementioned method is accompanied with the following problems.

First of all, since the emitter is formed by taking advantage of the phenomenon that the diameter of the pin-hole which corresponds to the opening size of the hole 105 becomes gradually smaller in the rotational vapor deposition method, the height and shape of the emitter become non-uniform, thus deteriorating the uniformity in field emission of the emitter. Furthermore, since the reproducibility of the shape and the yield of well-shaped emitter become poor as a result, it will lead to a great increase in cost when a large number of the field emission cold-cathode devices having an excellent uniformity in quality are to be formed on a single substrate.

Additionally, since it is difficult according to the aforementioned conventional method to form a sufficiently sharp distal tip portion of the emitter which is required for improving the efficiency of field emission, not only the efficiency of field emission is deteriorated but also the power consumption by the emitter would be increased. When a high driving voltage is employed, the shape of the tip portion of emitter tends to be deformed by an influence from ionized residual gas generated by this high voltage, thus giving rise to problems of deterioration in reliability and life of the product.

BRIEF SUMMARY OF THE INVENTION

Accordingly, the present invention has been accomplished for solving these problems of the prior art, and therefore an object of the present invention is to provide a field emission cold-cathode device, which is suited to improve the productivity thereof, uniform in field emission property, capable of being actuated with a low voltage, and high in field emission efficiency.

A further object of this invention is to provide a method of manufacturing a field emission cold-cathode device having the aforementioned features.

According to a first aspect of the present invention, there is provided a method of manufacturing a field emission cold-cathode device comprising a supporting substrate, and an emitter for emitting electrons disposed on the supporting substrate, the method comprising the steps of;

forming on a master substrate a projection tapering toward its distal end;

forming a mold substrate over the master substrate with the projection being interposed between the master substrate and the mold substrate, thereby forming a recess in the mold substrate, the recess corresponding in shape to the projection;

separating the master substrate from the mold substrate, thereby allowing the recess of the mold substrate to be exposed;

filling the recess with an emitter material, thereby forming the emitter in the mold substrate, the emitter corresponding in shape to the recess;

forming the supporting substrate on the mold substrate so as to cause the supporting substrate to be bonded with the emitter; and separating the mold substrate from the supporting substrate and the emitter.

According to a second aspect of the present invention, there is provided a field emission cold-cathode device comprising a supporting substrate, and an emitter for emitting electrons disposed on the supporting substrate, wherein the emitter has a surface provided with an engaging concave portion to be bonded with the supporting substrate, and the supporting substrate is integrally provided with a convex portion to be hermetically fitted with the engaging concave portion.

According to this invention, a projection is at first formed as a mother mold on the surface of a master substrate or a premaster substrate, and then the emitter is formed by taking a copy from this projection. Accordingly, if the distal tip portion of the projection formed on a master substrate or a premaster substrate is made sharp in advance, it is possible to easily manufacture a large number of field emission cold-cathode devices each provided with a emitter having a sharp distal tip end. Namely, this invention provides such a manufacturing method which enables to manufacture a field emission cold-cathode device, which is suited for improving the productivity thereof, uniform in field emission property, capable of being actuated with a low voltage, and high in field emission efficiency.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

FIGS. 1A to 1G show schematical cross-sectional views sequentially illustrating a manufacturing process of a field emission cold-cathode device according to one embodiment of this invention.

Figure 1A:
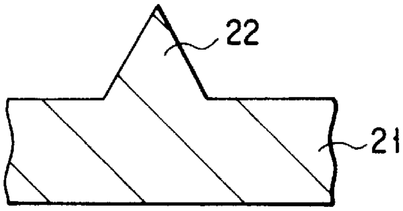
FIGS. 1A to 1G are schematical cross-sectional views sequentially illustrating a manufacturing process of a field emission cold-cathode device according to one embodiment of this invention.
Figure 1E:
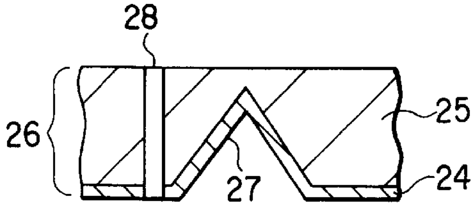
Figure 1B:
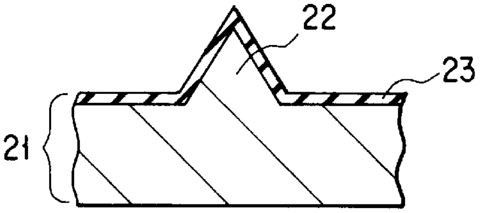
Figure 1F:
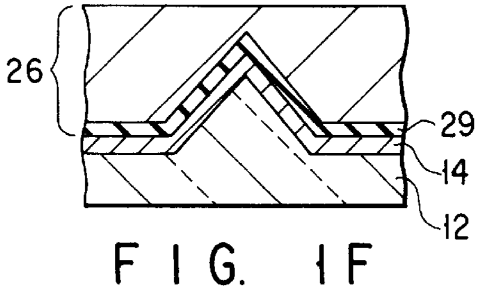
Figure 1C:
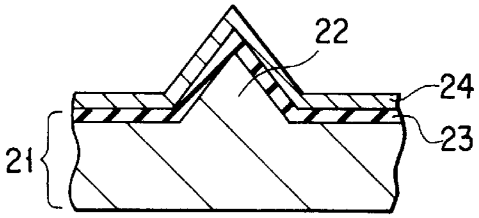
Figure 1G:
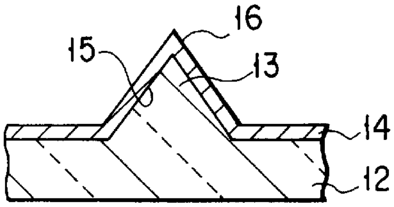

As shown in FIG. 1G, the field emission cold-cathode device according to this embodiment comprises a supporting substrate 12, and an emitter 16 formed on the supporting substrate 12 for emitting electrons. The number of the emitters 16 to be formed on the supporting substrate 12 may be single or plural depending on the end-use of the field emission cold-cathode device (in this FIG., only one is shown).

The supporting substrate 12 is essentially formed of an insulating material such as thermoplastic resins, ultraviolet-curing resins and thermosetting resins. The supporting substrate 12 may be formed of a transparent resin for instance. It is preferable for the supporting substrate 12 to be transparent where the field emission cold-cathode device is used for constituting a vacuum micro-display of the reflection type. This display type uses the rear side of the supporting substrate 12 as the display face, and thus requires the display light to be transmitted through the substrate 12.

The emitter 16 can be formed by molding a portion of a conductive material (such as Au) layer 14 which has been disposed on the supporting substrate 12 into a conical shape. The conductive material layer 14 functions also as a cathode wiring. An engaging concave portion 15 is formed on a surface of the emitter 16 to be bonded with the supporting substrate 12. In conformity with this engaging concave portion 15, a convex portion is integrally formed on the supporting substrate 12 so as to be hermetically fitted in the engaging concave portion 15.

Next, a method of manufacturing the field emission cold-cathode device according to this embodiment will be explained with reference to FIGS. 1A to 1G.

Figure 7A:
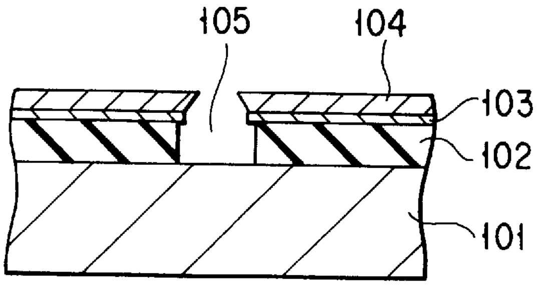
FIG. 7A (PRIOR ART)
FIGS. 7A to 7C are schematical cross-sectional views sequentially illustrating a manufacturing process of a field emission cold-cathode device according to a conventional method.
Figure 7B:
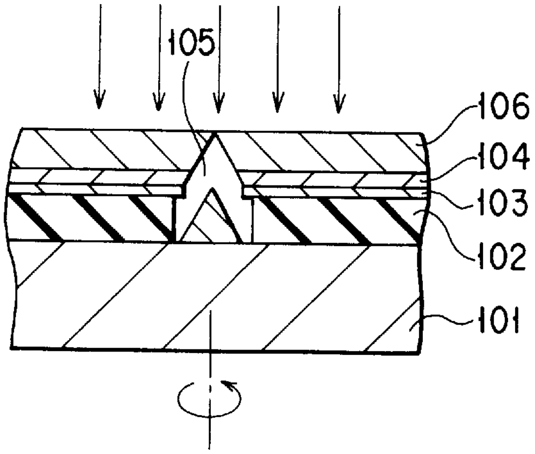
FIG. 7B (PRIOR ART)
Figure 7C:
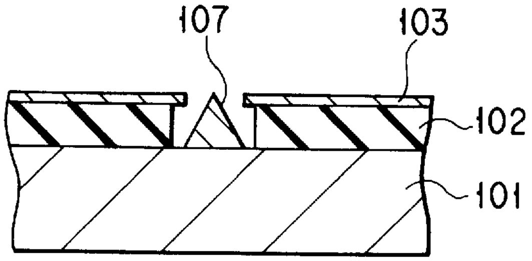
FIG. 7C (PRIOR ART)

First of all, a master substrate 21 having a projected portion 22 tapering toward the distal end thereof is prepared (FIG. 1A). As for the material for this master substrate 21, a conductive material such as Ni, Ti, Cr, etc. whose surface can be turned into an insulating layer through oxidation thereof can be employed. In the explanation of this embodiment, Ni is employed as a material for the master substrate 21. This master substrate 21 can be manufactured by various methods such as the conventional method illustrated in FIGS. 7A to 7C or a method to be explained hereinafter with reference to drawings.

Then, the surface of the master substrate 21 on which the projection 22 is formed in advance is entirely oxidized thereby to cover the surface provided with the projection 22 with an $NiO_2$ insulating layer 23 (FIG. 1B). Then, a thin profiling layer 24 is deposited on the surface of the insulating layer 23 (FIG. 1C). As for the material for this profiling layer 24, a conductive material such as Ni, Ti, Cr, etc. whose surface can be turned into an insulating layer through oxidation thereof can be employed. In the explanation of this embodiment, Ni is employed as a material for the profiling layer 24.

Figure 1D:
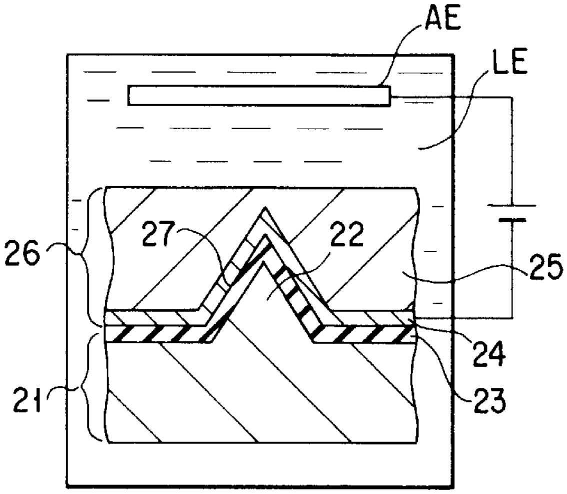

Then, the master substrate 21 provided with the layers 23 and 24 is dipped in an electrolyte solution LE for Ni plating. Under this condition, a thick supporting layer 25 consisting of Ni is formed on the surface of the profiling layer 24 by means of electroplating wherein the profiling layer 24 is employed as a cathode electrode, while a Ni electrode such as a depolarized Ni electrode which is high in dissolving efficiency is employed as an anode electrode AE (FIG. 1D). This supporting layer 25 may be formed by means of deposition method such as sputtering, instead of employing the aforementioned electroplating.

These profiling layer 24 and supporting layer 25 function as a mold substrate 26. Therefore, the mold substrate 26 is now provided with a recess 27 which corresponds completely to the shape of the projection 22 of the master substrate 21 covered with the insulating layer 23. Then, the insulating layer 23 is pulled away from the profiling layer 24 thereby separating the master substrate 21 from the mold substrate 26, thus allowing the recess 27 to be exposed (FIG. 1E).

If required, a vent hole 28 enabling gas to pass therethrough, i.e. a gas vent hole to be utilized at the occasion of forming the emitter may be formed such that the gas vent hole passes through the mold substrate 26 and opens to the surface where the recess 27 is formed. If a plurality of the recesses 27 are to be formed, this vent hole 28 may be formed at each space between adjacent recesses 27 or at intervals of every several recesses 27. Furthermore, the position of the opening of the vent hole 28 is not necessarily limited to a space between adjacent recesses 27, but may be within the region of the recess 27. The opening of the vent hole 28 may be shaped such that the opening is extended over a plurality of recesses 27. This vent hole 28 can be formed by making use of etching, drilling, frame spraying (spraying with a fused metal), sand blast, ultrasonic wave or a laser.

Then, the surface of the mold substrate 26 where the recess 27 is formed is entirely oxidized to cover this surface with an $NiO_2$ insulating layer 29. Subsequently, the conductive material (such as Au) layer 14 is formed over the surface of the insulating layer 29, thereby forming the emitter 16 covered with the insulating layer 29 and having a shape completely corresponding to the shape of the recess 27. In this case, the conductive material layer 14 should be made sufficiently thin so as to form an engaging concave portion 15 in the surface to be bonded with the supporting substrate 12 of the emitter 16.

Then, the supporting substrate 12 is formed on the mold substrate 26 such that it is bonded to both conductive material layer 14 and emitter 16 as explained below. At this moment, the convex portion 13 which is to be hermetically fitted with the engaging concave portion 15 of the emitter 16 is formed integral with the supporting substrate 12 (FIG. 1G). Then, the insulating layer 29 is pulled away from the conductive material layer 14 thereby separating the mold substrate 26 from the supporting substrate 12 (FIG. 1G).

The supporting substrate 12 may be formed by curing a synthetic resin such as thermoplastic resins, ultraviolet-curing resins and thermosetting resins by making use of compression, ultraviolet rays and low pressure casting, respectively. The thermoplastic resin useful in this case may be selected from polycarbonate resin, amorphous polyolefin resin and polymethylmethacrylate resin. The ultraviolet-curing resin may be selected from acrylic resin and epoxy resin. As for the thermosetting resin, epoxy resin or polymethylmethacrylate resin may be employed.

The supporting substrate 12 and the convex portion 13 of the supporting substrate 12 may be formed by means of stamping, i.e. by pressing the mold substrate 26 provided with emitter 16 having the engaging concave portion 15 onto a plastic material of the supporting substrate.

Alternatively, the supporting substrate 12 and the convex portion 13 of the supporting substrate 12 may be formed by the following molding method. Namely, a compressible closed space is formed at first by making use of a mold frame or vessel on the mold substrate 26 provided with the emitter 16 having the engaging concave portion 15, and then a supporting substrate material comprising a thermoplastic resin is introduced under pressure into the closed space and cured therein.

Alternatively, the supporting substrate 12 and the convex portion 13 of the supporting substrate 12 may be formed by the following molding method. Namely, a transparent substrates is arranged to face the mold substrate 26 at first so as to form a closed space over the mold substrate 26 provided with the emitter 16 having the engaging concave portion 15, and then a supporting substrate material comprising an ultraviolet-curing resin is introduced into the closed space and cured therein by radiating ultraviolet rays onto the resin.

Alternatively, the supporting substrate 12 and the convex portion 13 of the supporting substrate 12 may be formed by the following molding method. Namely, a closed space having a height corresponding to the thickness of the supporting substrate 12 is formed at first by making use of a mold frame or vessel on the mold substrate 26 provided with the emitter 16 having the engaging concave portion 15, and then a supporting substrate material comprising a thermosetting resin is introduced under the atmospheric pressure into the closed space and thermally cured therein.

FIGS. 2A to 2F show schematical cross-sectional views sequentially illustrating a manufacturing process of a field emission cold-cathode device according to another embodiment of this invention. In this embodiment shown in FIGS. 2A to 2F, the same portions as those illustrated already in the embodiment shown in FIGS. 1A to 1G will be identified by the same reference numerals so as to omit the detailed explanations thereof.

Figure 2A:
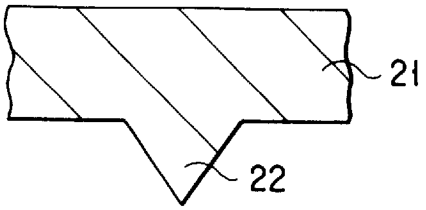
FIGS. 2A to 2F are schematical cross-sectional views sequentially illustrating a manufacturing process of a field emission cold-cathode device according to another embodiment of this invention.
Figure 2B:
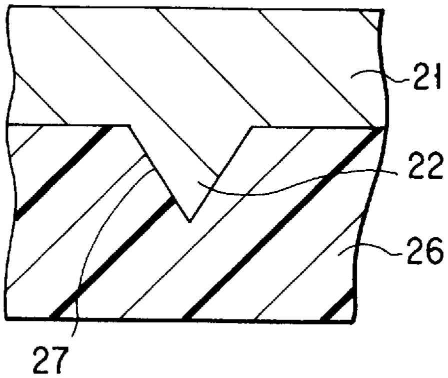
Figure 2C:
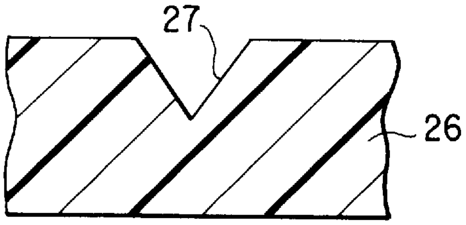
Figure 2D:
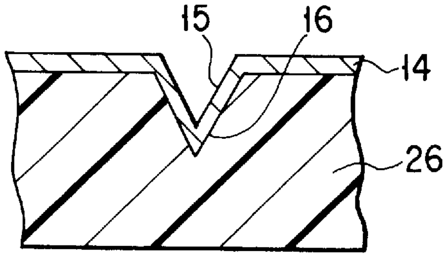
Figure 2E:
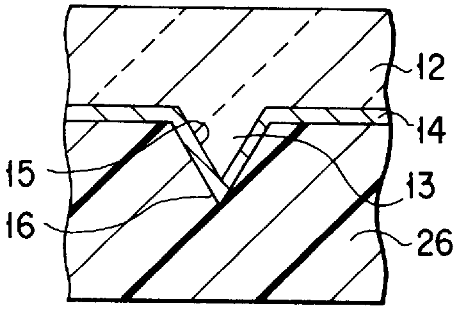
Figure 2F:
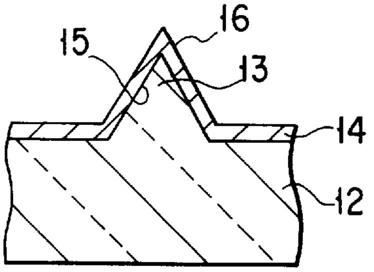

As shown in FIG. 2F, the field emission cold-cathode device according to this embodiment is constituted by substantially the same constituents as the ones illustrated in FIG. 1G, i.e. it comprises a supporting substrate 12, and an emitter 16 formed on the supporting substrate 12 for emitting electrons.

The number of the emitters 16 to be formed on the supporting substrate 12 may be single or plural depending on the end-use of the field emission cold-cathode device (in this FIG., only one is shown).

The conductive material (such as Au) layer 14 constituting the emitter 16 functions also as a cathode wiring. An engaging concave portion 15 is formed on a surface of the emitter 16 to be bonded with the supporting substrate 12. In conformity with this engaging concave portion 15, a convex portion is integrally formed on the supporting substrate 12 (which is made of a transparent synthetic resin for instance) so as to be hermetically fitted in the engaging concave portion 15.

Next, a method of manufacturing the field emission cold-cathode device according to this embodiment will be explained with reference to FIGS. 2A to 2F.

First of all, a master substrate 21 having a projected portion 22 tapering toward the distal end thereof is prepared (FIG. 2A). Unlike the embodiment shown in FIGS. 1A to 1G, the material for this master substrate 21 in this embodiment is not necessarily formed of a conductive material whose surface can be turned into an insulating layer through oxidation thereof. In the explanation of this embodiment, Ni is employed as a material for the master substrate 21. Then, the mold substrate 26 which is formed of a synthetic resin is formed on the master substrate 21 with the projection being interposed therebetween. As a result, a recess 27 which corresponds completely to the shape of the projection 22 of the master substrate 21 is formed on the mold substrate 26 (FIG. 2B). The mold substrate 26 may be formed by curing a synthetic resin such as thermoplastic resins, ultraviolet-curing resins and thermosetting resins by making use of compression, ultraviolet rays and low pressure casting, respectively. The thermoplastic resin useful in this case may be selected from polycarbonate resin, amorphous polyolefin resin and polymethylmethacrylate resin. The ultraviolet-curing resin may be selected from acrylic resin and epoxy resin. As for the thermosetting resin, epoxy resin or polymethylmethacrylate resin may be employed.

Then, the master substrate 21 is separated from the mold substrate 26, thus allowing the recess 27 to be exposed (FIG. 2C). Subsequently, the conductive material (such as Au) layer 14 is formed over the surface of the mold substrate 26, thereby forming the emitter 16 having a shape completely corresponding to the shape of the recess 27 (FIG. 2D). In this case, the conductive material layer 14 should be made sufficiently thin so as to form an engaging concave portion 15 in the surface to be bonded with the supporting substrate 12 of the emitter 16.

Then, the supporting substrate 12 is formed on the mold substrate 26 such that it is bonded to both conductive material layer 14 and emitter 16 as explained below. At this moment, the convex portion 13 which is to be hermetically fitted with the engaging concave portion 15 of the emitter 16 is formed integral with the supporting substrate 12 (FIG. 2E). Then, mold substrate 26 is pulled away from the conductive material layer 14 thereby separating the mold substrate 26 from the supporting substrate 12 (FIG. 2F).

FIGS. 3A to 3F show schematical cross-sectional views sequentially illustrating a manufacturing process of a field emission cold-cathode device according to another embodiment of this invention. In this embodiment shown in FIGS. 3A to 3F, the same portions as those illustrated already in the embodiment shown in FIGS. 1A to 2F will be identified by the same reference numerals so as to omit the detailed explanations thereof.

Figure 3A:
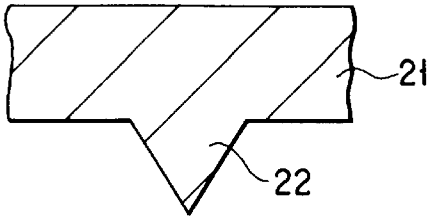
FIGS. 3A to 3F are schematical cross-sectional views sequentially illustrating a manufacturing process of a field emission cold-cathode device according to still another embodiment of this invention.
Figure 3B:
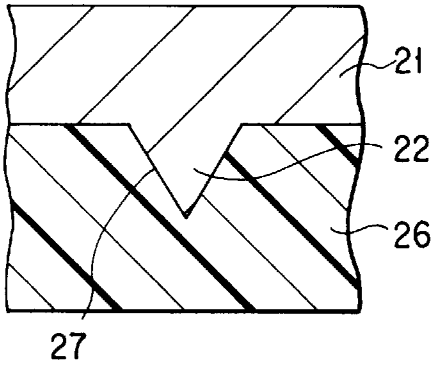
Figure 3C:
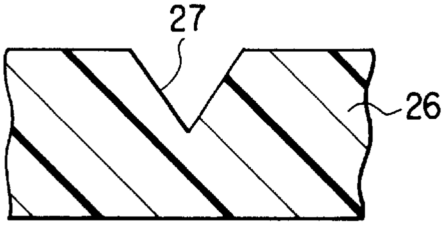
Figure 3D:
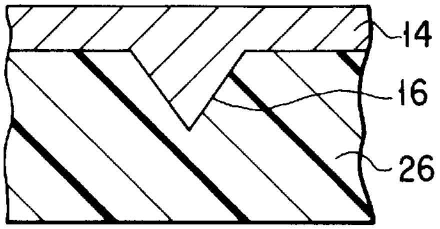
Figure 3E:
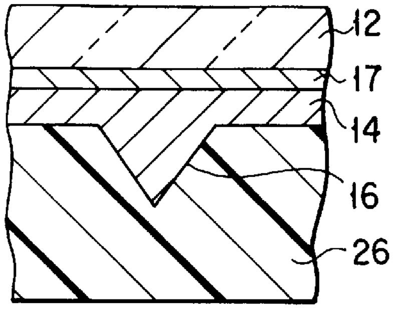
Figure 3F:
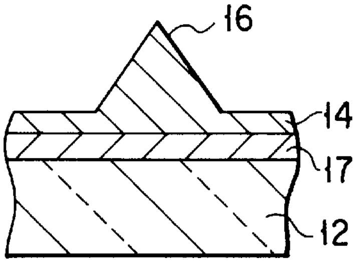

As shown in FIG. 3F, the field emission cold-cathode device according to this embodiment comprises a supporting substrate 12, and an emitter 16 formed on the supporting substrate 12 for emitting electrons, the constructions of the substrate 12 and emitter 16 being somewhat different from those illustrated in FIGS. 1G and 2F. The number of the emitters 16 to be formed on the supporting substrate 12 may be single or plural depending on the end-use of the field emission cold-cathode device (in this FIG., only one is shown).

A cathode wiring layer 17 is interposed between the supporting substrate 12 and the emitter 16.

This cathode wiring layer 17 is essentially formed of a transparent conductive material such as ITO, or a conductive material, such as Cu, Cr, or Al. The supporting substrate 12 is formed of a transparent glass and bonded with the conductive material (such as Au) layer 14 constituting the emitter 16 by means of electrostatic bonding method with the cathode wiring layer 17 being interposed therebetween. Both surfaces of the supporting substrate 12 and emitter 16, which face to each other are almost flat in surface and free from the convex portion 13 and from the engaging concave portion 15.

Next, a method of manufacturing the field emission cold-cathode device according to this embodiment will be explained with reference to FIGS. 3A to 3F.

First of all, a master substrate 21 having a projected portion 22 tapering toward the distal end thereof is prepared (FIG. 3A). Unlike the embodiment shown in FIGS. 1A to 1G, the material for this master substrate 21 in this embodiment is not necessarily formed of a conductive material whose surface can be turned into an insulating layer through oxidation thereof. In the explanation of this embodiment, Ni is employed as a material for the master substrate 21. Then, the mold substrate 26 which is formed of a synthetic resin is formed on the master substrate 21 with the projection being interposed therebetween. As a result, a recess 27 which corresponds completely to the shape of the projection 22 of the master substrate 21 is formed on the mold substrate 26 (FIG. 3B).

Then, the master substrate 21 is separated from the mold substrate 26, thus allowing the recess 27 to be exposed (FIG. 3C). Subsequently, the conductive material (such as Au) layer 14 is formed over the surface of the mold substrate 26, thereby forming the emitter 16 having a shape completely corresponding to the shape of the recess 27 (FIG. 3D). In this case, the conductive material layer 14 should be made sufficiently thicker than the depth of the recess 27 so as to make flat the reverse surface of the emitter 16, as far as possible or if possible.

Then, the cathode layer 17 is formed on the conductive material layer 14, and then the supporting substrate 12 formed of glass is adhered on the cathode layer 17 (FIG. 3E). In this case, the conductive material layer 14 and the supporting substrate 12 are bonded by means of electrostatic bonding method with the cathode layer 17 being interposed therebetween. Then, mold substrate 26 is pulled away from the conductive material layer 14 thereby separating the mold substrate 26 from the supporting substrate 12 (FIG. 3F).

According to the manufacturing methods illustrated in FIGS. 1A to 3F, it is possible to manufacture a plurality of mold substrate 26 from a single master substrate 21, and at the same time, to manufacture a plurality of field emission cold-cathode devices from a single mold substrate 26. Therefore, if the distal tip portion of the projection 22 of a master substrate is made sharp in advance, it is possible to easily manufacture a large number of field emission cold-cathode devices each provided with a emitter having a sharp distal tip end.

FIGS. 4A to 4I are schematical cross-sectional views sequentially illustrating a manufacturing process of a field emission cold-cathode device according to still another embodiment of this invention. In this embodiment shown in FIGS. 4A to 4I, the same portions as those illustrated already in the embodiment shown in FIGS. 1A to 3F will be identified by the same reference numerals so as to omit the detailed explanations thereof.

Figure 4A:
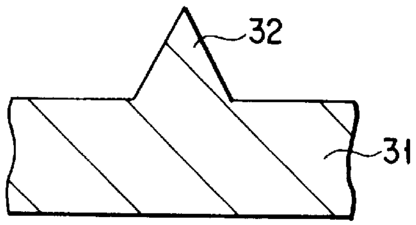
FIGS. 4A to 4I are schematical cross-sectional views sequentially illustrating a manufacturing process of a field emission cold-cathode device according to still another embodiment of this invention.
Figure 4E:
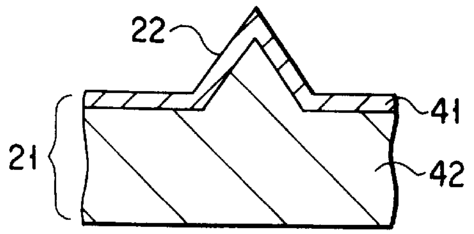
Figure 4B:
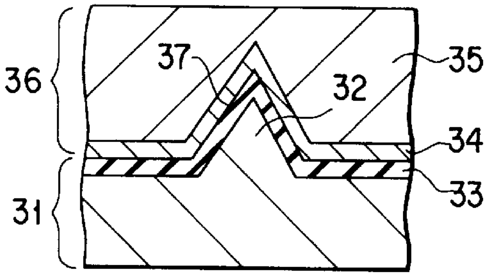
Figure 4F:
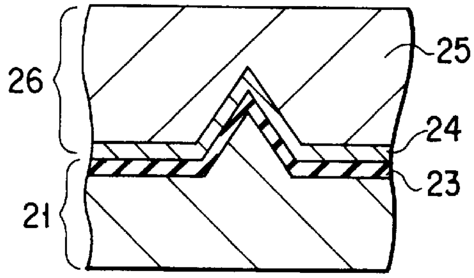
Figure 4C:
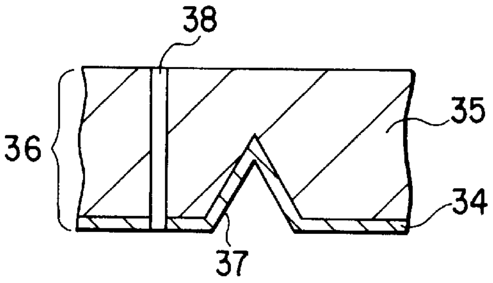
Figure 4G:
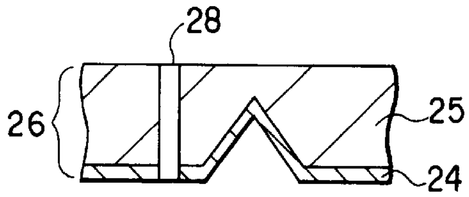
Figure 4D:
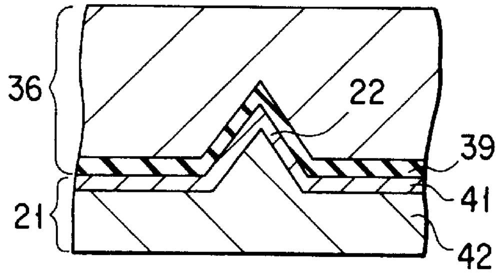
Figure 4H:
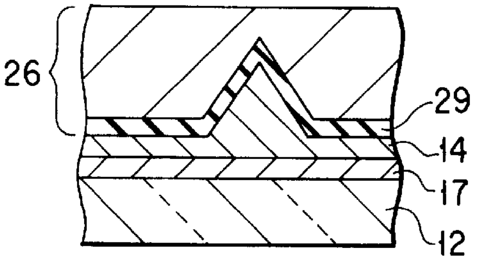
Figure 4I:
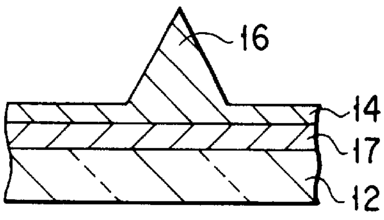

As shown in FIG. 4I, the field emission cold-cathode device according to this embodiment comprises a supporting substrate 12, and an emitter 16 formed on the supporting substrate 12 for emitting electrons, the constructions of the substrate 12 and emitter 16 being substantially the same as that illustrated in FIG. 3F. The number of the emitters 16 to be formed on the supporting substrate 12 may be single or plural depending on the end-use of the field emission cold-cathode device (in this FIG., only one is shown).

A cathode wiring layer 17 is interposed between the supporting substrate 12 and the emitter 16. This cathode wiring layer 17 is essentially formed of a transparent conductive material such as ITO, or a conductive material, such as Cu, Cr, or Al. The supporting substrate 12 is formed of a transparent glass and bonded with the conductive material (such as Au) layer 14 constituting the emitter 16 by means of electrostatic bonding method with the cathode wiring layer 17 being interposed therebetween. Both surfaces of the supporting substrate 12 and emitter 16, which face to each other are almost flat in surface and free from the convex portion 13 and from the engaging concave portion 15.

Next, a method of manufacturing the field emission cold-cathode device according to this embodiment will be explained with reference to FIGS. 4A to 4I.

First of all, a premaster substrate 31 having a projected portion 32 tapering toward the distal end thereof is prepared (FIG. 4A). As for the material for this premaster substrate 31, a conductive material such as Ni, Ti, Cr, etc. whose surface can be turned into an insulating layer through oxidation thereof can be employed. In the explanation of this embodiment, Ni is employed as a material for the premaster substrate 31. This premaster substrate 31 can be manufactured by various methods such as the conventional method illustrated in FIGS. 7A to 7C or a method to be explained hereinafter with reference to drawings.

Then, the surface of the premaster substrate 31 on which the projection 32 is formed in advance is entirely oxidized thereby to cover the surface provided with the projection 32 with an $NiO_2$ insulating layer 33. Then, a thin profiling layer 34 is deposited on the surface of the insulating layer 33. As for the material for this profiling layer 34, a conductive material such as Ni, Ti, Cr, etc. whose surface can be turned into an insulating layer through oxidation thereof can be employed. In the explanation of this embodiment, Ni is employed as a material for the profiling layer 34.

Then, in the same manner as illustrated in FIG. 1D, an electroplating is performed employing the profiling layer 34 as a cathode electrode to form a thick supporting layer (a Ni layer) 35 on the profiling layer 34 (FIG. 4B). This supporting layer 35 may be formed by means of deposition method such as sputtering, instead of employing the aforementioned electroplating.

These profiling layer 34 and supporting layer 35 function as a premold substrate 36. Therefore, the premold substrate 36 is now provided with a recess 37 which corresponds completely to the shape of the projection 32 of the premaster substrate 31 covered with the insulating layer 33. Then, the insulating layer 33 is pulled away from the profiling layer 34 thereby separating the premaster substrate 31 from the premold substrate 36, thus allowing the recess 37 to be exposed (FIG. 4C).

If required, a vent hole 38 enabling gas to pass therethrough, i.e. a gas vent hole may be formed such that the gas vent hole passes through the premold substrate 36 and opens to the surface where the recess 37 is formed. This vent hole 38 may be formed in the same manner and same construction as in the case of the vent hole 28 shown in FIG. 1E.

Then, the surface of the premold substrate 36 where the recess 37 is formed is entirely oxidized to cover this surface with an $NiO_2$ insulating layer 39. Then, a thin profiling layer 41 is deposited on the surface of the insulating layer 39. As for the material for this profiling layer 41, a conductive material such as Ni, Ti, Cr, etc. whose surface can be turned into an insulating layer through oxidation thereof can be employed. In the explanation of this embodiment, Ni is employed as a material for the profiling layer 41.

Then, in the same manner as illustrated in FIG. 1D, an electroplating is performed employing the profiling layer 41 as a cathode electrode to form a thick supporting layer (a Ni layer) 42 on the profiling layer 41 (FIG. 4D). This supporting layer 42 may be formed by means of deposition method such as sputtering, instead of employing the aforementioned electroplating.

These profiling layer 41 and supporting layer 42 constitute the master substrate 21. Namely, the master substrate 21 is now provided with a projected portion 22 which corresponds completely to the shape of the recess 37 of the premold substrate 36 covered with the insulating layer 39. Then, the insulating layer 39 is pulled away from the profiling layer 41 thereby separating the premold substrate 36 from the master substrate 21, thus allowing the projected portion 22 to be exposed (FIG. 4E). As a result, the master substrate 21 provided with the projected portion 22 tapering toward the distal end thereof is prepared.

Next, the mold substrate 26 is formed following the processes explained with reference to FIGS. 1B to 1E.

Namely, the surface of the master substrate 21 on which the projection 22 is formed in advance is entirely oxidized thereby to cover the surface provided with the projection 22 with an $NiO_2$ insulating layer 23. Then, a thin profiling layer 24 is deposited on the surface of the insulating layer 23. Then, a thick supporting layer 25 consisting of Ni is formed on the surface of the profiling layer 24 by means of electroplating or sputtering (FIG. 4F). Then, the insulating layer 23 is pulled away from the profiling layer 24 thereby separating the master substrate 21 from the mold substrate 26, thus allowing the recess 27 to be exposed (FIG. 4G).

If required, a vent hole 28 enabling gas to pass therethrough, i.e. a gas vent hole may be formed on the mold substrate 26.

Then, the surface of the mold substrate 26 where the recess 27 is formed is entirely oxidized to cover this surface with an $NiO_2$ insulating layer 29. Subsequently, the conductive material (such as Au) layer 14 is formed over the surface of the insulating layer 29, thereby forming the emitter 16 covered with the insulating layer 29 and having a shape completely corresponding to the shape of the recess 27. In this case, the conductive material layer 14 should be made sufficiently thicker than the depth of the recess 27 so as to make the reverse surface of the emitter 16 flat.

Then, the cathode wiring layer 17 is formed on the surface of the conductive material layer 14, and the supporting substrate 12 is deposited on the cathode wiring layer 17 (FIG. 4H). In this case, the supporting substrate 12 is bonded with the conductive material layer 14 by means of electrostatic bonding method with the cathode wiring layer 17 being interposed therebetween. Then, the insulating layer 29 is pulled away from the conductive material layer 14 thereby separating the mold substrate 26 from the supporting substrate 12 (FIG. 4I).

According to the manufacturing methods illustrated in FIGS. 4A to 4I, it is possible to obtain a further advantage, in addition to the advantages obtained by the manufacturing methods illustrated in FIGS. 1A to 3F, that a plurality of premold substrates 36 can be obtained from a single premaster substrate 31, and at the same time, a plurality of master substrates 21 can be formed from a single premold substrate 36. Therefore, if the distal tip portion of the projection 32 of a premaster substrate is made sharp in advance, it is possible to easily manufacture a large number of field emission cold-cathode devices each provided with a emitter having a sharp distal tip end.

The master substrate 21 or the premaster substrate 31 employed in the manufacturing methods illustrated in FIGS. 1A to 4I can be manufactured by the method shown in FIGS. 5A to 5G. Followings are explanations on the manufacturing method shown in FIGS. 5A to 5G.

First of all, a recess having a sharp bottom edge is formed on one surface of a premold substrate. The formation of this recess can be formed by making use of an anisotropic etching of a Si monocrystalline substrate as explained below.

Figure 5A:
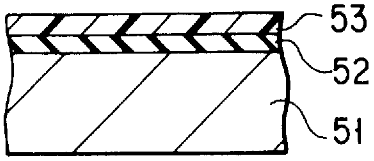
FIGS. 5A to 5G are schematical cross-sectional views sequentially illustrating a manufacturing process of a master substrate or a premaster substrate employed in the manufacturing method shown in FIGS. 4A to 4I.

First of all, an $SiO_2$ thermal oxide layer 52 having a thickness of 0.1 $\mu$m is formed, by means of a dry oxidation method, on a p-type Si monocrystalline substrate 51 (to be used as a premold substrate) having a crystal orientation of (100). Then, a resist is spin-coated on the surface of the thermal oxide layer 52 to form a resist layer 53 (FIG. 5A).

Figure 5B:
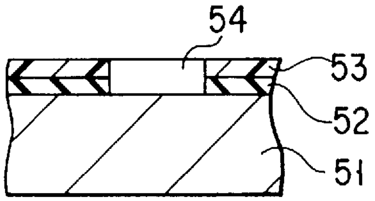

The resist layer 53 is then subjected to a patterning treatment by way of exposure and development so as to form a plurality of openings 54 (each having a square opening having a size of 1 $\mu$m square for instance). Then, the etching of the $SiO_2$ layer 52 is performed using the pattern of resist layer 53 as a mask and an $NH_4F/HF$ mixed solution as an etching solution (FIG. 5B).

Figure 5C:
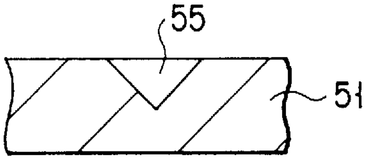

After the resist layer 53 is removed, the Si monocrystalline substrate 51 is subjected to an anisotropic etching by making use of a 30 wt % aqueous solution of KOH thereby to form a recess 55 having a depth of 0.71 $\mu$m in the surface of the Si monocrystalline substrate 51. Thereafter, the $SiO_2$ layer 52 is removed by making use of an $NH_4F/HF$ mixed solution (FIG. 5C). As a result of the aforementioned etching using an aqueous solution of KOH, the recess 55 is formed to have a reverse pyramid-like shape constituted by four slanting surfaces of (111) crystal face.

Figure 5D:
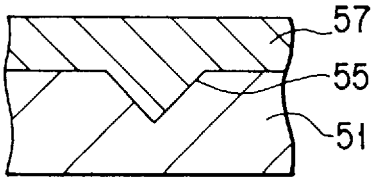

In this case, the Si monocrystalline substrate 51 provided with the recess 55 may be thermally oxidized by means of a wet oxidation method thereby to form an $SiO_2$ thermal oxide insulating layer all over the surface including the recess 55. When this $SiO_2$ thermal oxide insulating layer is formed in this manner, the distal tip portion of the projection 61 that can be formed by making use of this recess 55 as a mold can be made more sharp, as shown in FIG. 5G.

Then, a conductive material (Ni for instance) layer 57 which is to be subsequently formed into a projection portion of a master substrate or premaster substrate is deposited on the premold substrate (i.e. the Si monocrystalline substrate 51) so as to fill the recess 55 with the conductive material layer 57. Specifically, the conductive material layer 57 is deposited such that not only the recess 55 is sufficiently filled with the conductive material layer 57, but also remaining portion other than the recess 55 can be also covered with a uniform thickness of the conductive material layer 57 (FIG. 5D). In this manner, the projection 61 having a shape completely corresponding to the shape of the recess 55 is constituted by the conductive material layer 57.

Figure 5E:
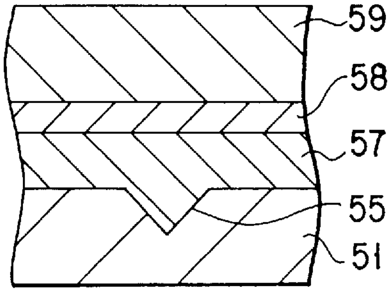
Figure 5F:
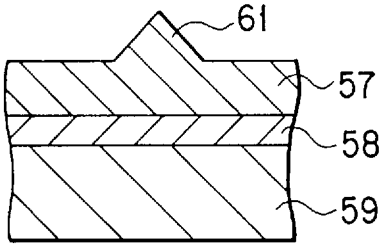
Figure 5G:
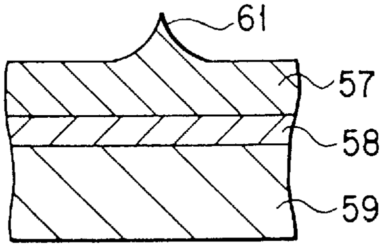

Thereafter, a supporting layer 59 is bonded via a bonding layer 58 to the conductive material layer 57 (FIG. 5E). Then, by making use of an aqueous solution comprising ethylene diamine/pyrocatechol/pyirazine (ethylene diamine:pyrocatechol:pyirazine:water=75 cc:12 g:3 mg:10 cc), the Si monocrystalline substrate 51 is etched away (FIG. 5F). In the structure thus obtained, the master substrate 21 or the premaster substrate 31 which are to be employed in the manufacturing methods illustrated in FIGS. 1A to 4I is constituted by the layers 57, 58 and 59, while the projection 22 of the master substrate or the projection 32 of the premaster substrate is constituted by the projection 61.

The field emission cold-cathode device to be manufactured by any of the method shown in FIGS. 1A to 4I may be further provided with a gate electrode to be functioned as a lead-out electrode, the gate electrode being disposed to face to the emitter 16. The method of mounting this gate electrode on the structure obtained by any of the methods illustrated in FIGS. 3A to 3F or FIGS. 4A to 4I will be explained as follows with reference to FIGS. 6A to 6D.

First of all, an insulating layer 71 consisting of a silicon oxide film is deposited to a thickness of about 30 nm to 300 nm on the conductive material layer 14 (including the emitter 16) after the construction shown in FIG. 3F or FIG. 4I has been obtained. Then, a conductive material layer 73 (to be formed into a gate electrode) consisting of a conductive material such as W is formed to a thickness of about 0.5 $\mu$m on the insulating layer 71 by means of sputtering.

Figure 6A:
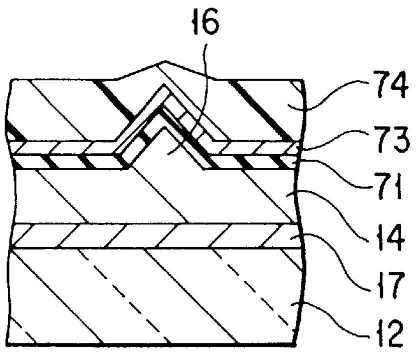
FIGS. 6A to 6D are schematical cross-sectional views sequentially illustrating a method of additionally forming a gate electrode in the structure obtained by the manufacturing method shown in FIGS. 4A to 4I.

Subsequently, a photo-resist layer 74 is spin-coated to a thickness of about 0.9 $\mu$m (i.e. a thickness sufficient to slightly cover the distal end portion of the projection of the conductive material layer 73) (FIG. 6A).

Figure 6B:
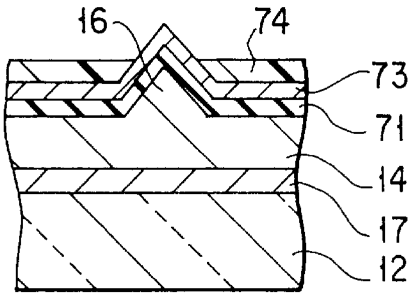
Figure 6C:
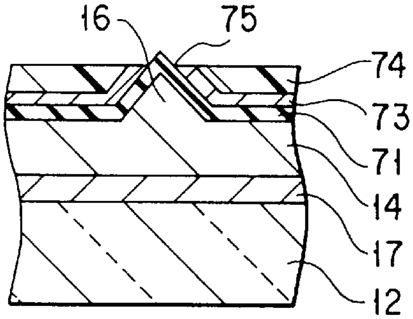
Figure 6D:
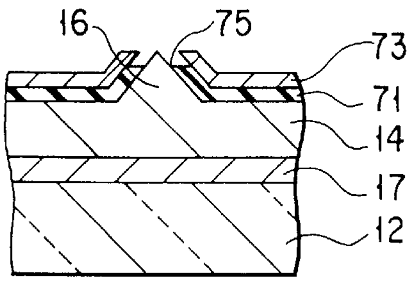

Then, the photo-resist layer 74 is subjected to a dry etching by means of oxygen plasma thereby etching away the resist layer 74 in such a degree that the top portion (about 0.7 $\mu$m) of the projection of conductive material layer 73 is exposed (FIG. 6B). Then, the top portion of the conductive material layer 73 is etched to form an opening 75 (FIG. 6C). Then, the resist layer 74 is removed and the insulating layer 71 is selectively removed by making use of an $NH_4F/HF$ mixed solution. As a result, the emitter 16 is allowed to expose within the opening 75 of the conductive material layer 73 (FIG. 6D).

In the field emission cold-cathode device to be manufactured by the method shown in FIGS. 6A to 6D, the conductive material layer 73 is formed on the conductive material layer 14 via the insulating layer 71, and functions as a gate electrode. Furthermore, the conductive material layer 73 is disposed to face and surround the emitter 16 with a space being kept therebetween.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A method of manufacturing a field emission cold-cathode device comprising a supporting substrate, and an emitter for emitting electrons disposed on said supporting substrate, said method comprising the steps of;

forming on a master substrate a projection tapering toward its distal end;

forming a mold substrate over said master substrate with said projection being interposed between said master substrate and said mold substrate, thereby forming a recess in said mold substrate, said recess corresponding in shape to said projection;

separating said master substrate from said mold substrate, thereby allowing said recess of said mold substrate to be exposed;

filling said recess with an emitter material, thereby forming said emitter in said mold substrate, said emitter corresponding in shape to said recess;

forming said supporting substrate on said mold substrate so as to cause said supporting substrate to be bonded with said emitter; and separating said mold substrate from said supporting substrate and said emitter.

2. The method according to claim 1, wherein said step of forming said supporting substrate is performed by employing, as a supporting substrate material, a synthetic resin selected from a group consisting of thermoplastic resins, ultraviolet-curing resins and thermosetting resins, and by curing said supporting substrate material by means selected from a group consisting of compression, ultraviolet rays and low pressure casting.

3. The method according to claim 2, wherein, in said supporting substrate material, said thermoplastic resin is selected from polycarbonate resin, amorphous polyolefin resin and polymethylmethacrylate resin; said ultraviolet-curing resin is selected from acrylic resin and epoxy resin; and said thermosetting resin is selected from epoxy resin and polymethylmethacrylate resin.

4. The method according to claim 2, wherein said step of forming said emitter comprises a step of forming an engaging concave portion in a surface to be bonded to said supporting substrate; and said step of forming said supporting substrate comprises a step of integrally forming a convex portion to be hermetically fitted in said engaging concave portion.

5. The method according to claim 4, wherein said step of forming said supporting substrate and said convex portion of said supporting substrate is performed by means of stamping such that said mold substrate provided with said emitter having said engaging concave portion is pressed onto said supporting substrate material comprising a synthetic resin.

6. The method according to claim 4, wherein said step of forming said supporting substrate and said convex portion of said supporting substrate is performed by forming a compressible closed space on said mold substrate provided with said emitter having said engaging concave portion, and then by introducing, under pressure, said supporting substrate material comprising a thermoplastic resin into said closed space to cure said supporting substrate material.

7. The method according to claim 4, wherein said step of forming said supporting substrate and said convex portion of said supporting substrate is performed by arranging a transparent substrate so as to form a closed space over said mold substrate provided with said emitter having said engaging concave portion, and then by introducing said supporting substrate material comprising an ultraviolet-curing resin into said closed space, and radiating ultraviolet rays thereon to cure said ultraviolet-curing resin.

8. The method according to claim 4, wherein said step of forming said supporting substrate and said convex portion of said supporting substrate is performed by forming a closed space having a height corresponding in thickness to said supporting substrate on said mold substrate provided with said emitter having said engaging concave portion, and then by introducing said supporting substrate material comprising a thermosetting resin under an atmospheric pressure into said closed space to thermally cure said thermosetting resin.

9. The method according to claim 1, comprising a step of covering said projection with an insulating layer prior to a step of forming said mold substrate on said master substrate.

10. The method according to claim 9, wherein said insulating layer covering said projection is formed by oxidizing a surface of said projection.

11. The method according to claim 10, wherein said master substrate consists essentially of a material selected from a group consisting of Ni, Ti and Cr.

12. The method according to claim 1, comprising a step of covering said recess with an insulating layer prior to a step of filling said recess with a material of said emitter.

13. The method according to claim 12, wherein said insulating layer covering said recess is formed by oxidizing a surface of said recess.

14. The method according to claim 13, wherein said mold substrate consists essentially of a material selected from a group consisting of Ni, Ti and Cr.

15. The method according to claim 1, wherein said mold substrate comprises a thin profiling layer covering said projection, and a thick supporting layer formed on said profiling layer.

16. The method according to claim 15, wherein said step of forming said mold substrate on said master substrate comprises the steps of; forming said profiling layer of a conductive material; and depositing said supporting layer on said profiling layer by means of electroplating while using said profiling layer as an electrode.

17. The method according to claim 1, wherein said step of forming said mold substrate is performed by employing, as a mold substrate material, a synthetic resin selected from a group consisting of thermoplastic resins, ultraviolet-curing resins and thermosetting resins, and by curing said mold substrate material by means selected from a group consisting of compression, ultraviolet rays and low pressure casting.

18. The method according to claim 17, wherein, in said mold substrate material, said thermoplastic resin is selected from polycarbonate resin, amorphous polyolefin resin and polymethylmethacrylate resin; said ultraviolet-curing resin is selected from acrylic resin and epoxy resin; and said thermosetting resin is selected from epoxy resin and polymethylmethacrylate resin.

19. The method according to claim 1, comprising a step of forming a vent hole enabling gas to pass therethrough in said mold substrate, said vent hole being opened to a surface where said recess is formed.

20. The method according to claim 19, wherein said step of forming said vent hole is performed by means selected from etching, drilling, frame spraying, sand blast, ultrasonic wave or a laser.

21. The method according to claim 1, wherein said step of forming said projection on said master substrate comprises the steps of;

- forming a first recess having a sharp bottom in a premold substrate by means of etching;
- forming said master substrate on said premold substrate so as to fill said first recess with said master substrate, thereby forming said projection corresponding to said first recess on said master substrate; and
- separating said premold substrate from said master substrate thereby to expose said projection of master substrate.

22. The method according to claim 1, wherein said step of forming said projection on said master substrate comprises the steps of;

- forming a first projection having a tapering distal end on a premaster substrate;
- forming a premold substrate on said premaster substrate with said first projection being interposed therebetween, thereby forming a first recess corresponding to said first projection in said premold substrate;
- separating said premaster substrate from said premold substrate thereby to expose said first recess of premold substrate;
- forming said master substrate on said premold substrate so as to fill said first recess with said master substrate, thereby forming said projection corresponding to said first recess on said master substrate; and
- separating said premold substrate from said master substrate thereby to expose said projection of master substrate.

23. The method according to claim 22, comprising a step of covering said first projection with an insulating layer prior to a step of forming said premold substrate on said premaster substrate.

24. The method according to claim 23, wherein said insulating layer covering said first projection is formed by oxidizing a surface of said first projection.

25. The method according to claim 24, wherein said premaster substrate consists essentially of a material selected from a group consisting of Ni, Ti and Cr.

26. The method according to claim 22, comprising a step of covering said first recess with an insulating layer prior to a step of forming said master substrate on said premold substrate.

27. The method according to claim 26, wherein said insulating layer covering said first recess is formed by oxidizing a surface of said first recess.

28. The method according to claim 27, wherein said premold substrate consists essentially of a material selected from a group consisting of Ni, Ti and Cr.

29. The method according to claim 22, wherein said premold substrate comprises a thin first layer covering said first projection, and a thick second layer formed on said first layer.

30. The method according to claim 29, wherein said step of forming said premold substrate on said premaster substrate comprises the steps of; forming said first layer of a conductive material; and depositing said second layer on said first layer by means of electroplating while using said first layer as an electrode.

31. The method according to claim 1, comprising a step of providing a gate electrode to face said emitter and to be supported by said supporting substrate through an insulating layer.

* * * * *